(12) United States Patent
Lane et al.

(10) Patent No.: US 12,412,748 B2
(45) Date of Patent: Sep. 9, 2025

(54) PLASMA PROCESSING WITH MAGNETIC RING X POINT

(71) Applicant: Tokyo Electron Limited, Tokyo (JP)

(72) Inventors: Barton Lane, Austin, TX (US); Peter Lowell George Ventzek, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 377 days.

(21) Appl. No.: 17/815,768

(22) Filed: Jul. 28, 2022

(65) Prior Publication Data

US 2024/0038506 A1 Feb. 1, 2024

(51) Int. Cl.
*H01L 21/306* (2006.01)
*H01J 37/32* (2006.01)
*H01L 21/3065* (2006.01)

(52) U.S. Cl.
CPC .... *H01L 21/3065* (2013.01); *H01J 37/32642* (2013.01); *H01J 37/32669* (2013.01)

(58) Field of Classification Search
CPC ........... H01J 37/32669; H01J 37/32642; H01J 37/3266; H01L 21/3065
USPC ..................................... 216/67; 438/706–714
See application file for complete search history.

(56) References Cited

U.S. PATENT DOCUMENTS

| | | | |
|---|---|---|---|
| 6,022,460 A | 2/2000 | O et al. | |
| 6,896,775 B2 | 5/2005 | Chistyakov | |
| 7,811,941 B1 | 10/2010 | Becker et al. | |
| 8,404,598 B2 | 3/2013 | Liao et al. | |
| 10,128,083 B2 | 11/2018 | Druz et al. | |
| 2016/0300697 A1 | 10/2016 | Whang et al. | |
| 2020/0294768 A1 | 9/2020 | Ohashi | |
| 2022/0208515 A1* | 6/2022 | Choi | H01J 37/32449 |

FOREIGN PATENT DOCUMENTS

| | | | |
|---|---|---|---|
| JP | H05339761 A | | 12/1993 |
| JP | 2020150220 A | | 9/2020 |
| JP | 202003817 A | * | 12/2020 |
| KR | 100844150 B1 | | 7/2008 |

(Continued)

OTHER PUBLICATIONS

Chen, W., et al., "SiO2 etching in magnetic neutral loop discharge plasma", Cite as: Journal of Vacuum Science & Technology A 16, 1594 (1998); https://doi.org/10.1116/1.581193, Oct. 27, 1998, 7 Pages.

*Primary Examiner* — Duy Vu N Deo
(74) *Attorney, Agent, or Firm* — Slater Matsil, LLP

(57) ABSTRACT

A plasma etching system that includes a plasma processing chamber, a substrate holder disposed in the plasma processing chamber, a RF power source configured to generate a plasma in the plasma processing chamber, a first magnet disposed above the substrate holder, the first magnet configured to apply, in the plasma processing chamber, an azimuthally symmetric magnetic field that is independent from a magnetic field generated by the RF power source, and a second magnet disposed below the substrate holder and configured to modify the azimuthally symmetric magnetic field and create a ring X point between the first magnet and the second magnet, where positions of the first magnet and the second magnet are arranged such that the ring X point is located nearer to an edge of the substrate holder than a center of the substrate holder.

20 Claims, 6 Drawing Sheets

(56) References Cited

FOREIGN PATENT DOCUMENTS

| TW | 201421528 A | 6/2014 | |
| WO | 0036631 A1 | 6/2000 | |
| WO | WO-2015080516 A1 * | 6/2015 | ............ H01J 37/321 |

* cited by examiner

PLASMA PROCESSING WITH MAGNETIC RING X POINT

TECHNICAL FIELD

The present invention relates generally to a system and method of plasma processing, and, in particular embodiments, to plasma processing with magnetic ring X point.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices are performed using plasma processes. Plasma processing techniques include chemical dry etching (CDE) (e.g., plasma ashing), physical or sputter etching, reactive ion etching (RIE), and plasma-enhanced chemical vapor deposition (PECVD).

Driven by an insatiable demand for low cost electronics with high functionality, the minimum feature sizes have been shrunk to reduce cost by roughly doubling the component packing density at each successive technology node. Innovations in patterning such as immersion photolithography, multiple patterning, and 13.5 nm wavelength extreme ultraviolet (EUV) optical systems have brought critical feature sizes down close to ten nanometers. Concurrently, unconventional materials such as organics, ferroelectrics, and chalcogenides are being increasingly used in products. This scenario poses a challenge for plasma technology to provide processes for patterning features with accuracy, precision, and profile control, often at atomic scale dimensions. Meeting this challenge along with the uniformity and repeatability needed for high volume IC manufacturing requires further innovations.

SUMMARY

In accordance with an embodiment of the present invention, a plasma etching system for a substrate that includes: a plasma processing chamber; a substrate holder disposed in the plasma processing chamber; a RF power source configured to generate a plasma in the plasma processing chamber; a first magnet disposed above the substrate holder, the first magnet configured to apply an azimuthally symmetric magnetic field in the plasma processing chamber, the azimuthally symmetric magnetic field being independent from a magnetic field generated by the RF power source; and a second magnet disposed below the substrate holder, the second magnet configured to modify the azimuthally symmetric magnetic field and create a ring X point where the azimuthally symmetric magnetic field is locally neutralized, the ring X point being between the first magnet and the second magnet, where positions of the first magnet and the second magnet are arranged such that the ring X point is located nearer to an edge of the substrate holder than a center of the substrate holder.

In accordance with an embodiment of the present invention, a plasma etching system for a substrate that includes: a plasma processing chamber; a substrate holder disposed in the plasma processing chamber; a focus ring concentrically surrounding the substrate holder; a RF power source configured to generate a plasma in the plasma processing chamber; and a plurality of magnets configured to apply an azimuthally symmetric magnetic field in the processing chamber, the azimuthally symmetric magnetic field including a ring X point where the azimuthally symmetric magnetic field is locally neutralized, the ring X point being located concentrically with the focus ring.

In accordance with an embodiment of the present invention, a method of processing a substrate that includes: loading the substrate in a plasma processing chamber, the substrate including a patterned hard mask layer and an underlying layer, the processing chamber including a RF power source and a set of electromagnets; flowing a process gas into the plasma processing chamber; providing power to the set of electromagnets to generate an azimuthally symmetric magnetic field in the plasma processing chamber, the azimuthally symmetric magnetic field including a ring X point where the azimuthally symmetric magnetic field is locally neutralized, the ring X point being located concentrically with the substrate; generating a plasma from the process gas in the plasma processing chamber by powering the RF power source; and while providing the power to the set of electromagnets, exposing the substrate to the plasma and etching the underlying layer selectively to the hard mask layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

This application relates to systems and methods of plasma processing, more particularly to controlling local density of plasma species using an applied magnetic field. Plasma etching often requires highly directional etching, and balancing etch rate, selectivity, and uniformity can be challenging. Wafer loading and non-uniformity are common issues for plasma processing, with species such as radicals and etch byproducts being unevenly distributed in the plasma. Non-uniformity is typically greatest at the wafer extreme edge (e.g., area within about 10 mm from the wafer edge), and this may result in non-uniform etch rate across the wafer, for example, lower at the wafer extreme edge than the center. Therefore, a new plasma technique that can provide a better uniformity for plasma etching may be desired. Embodiments of the present application disclose systems and methods of using an additional magnetic field to change plasma parameters, such as density of plasma species (i.e., plasma density). Specifically, in various embodiments, the additional magnetic field may be generated using at least two magnets such that the additional magnetic field has a ring X point, where the magnetic field is locally neutralized, near the edge of the substrate. Having the ring X point near the edge of the substrate advantageously enables local improvement of the plasma density and thereby improve the uniformity of the plasma accompanied by an enhanced local etch rate near the edge of the substrate.

Figure 5:
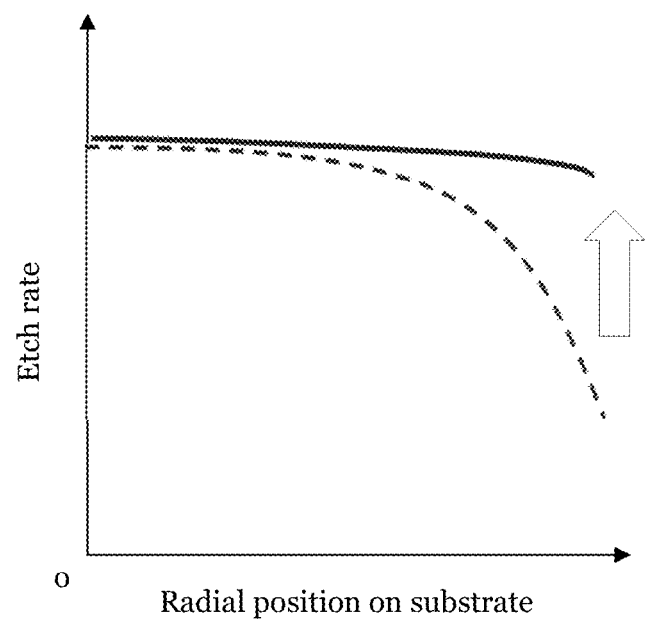
FIG. 5 illustrates the effect of creating a ring X point on etch rate as a function of a radial position in a plasma processing chamber in accordance with one embodiment.
Figure 6:
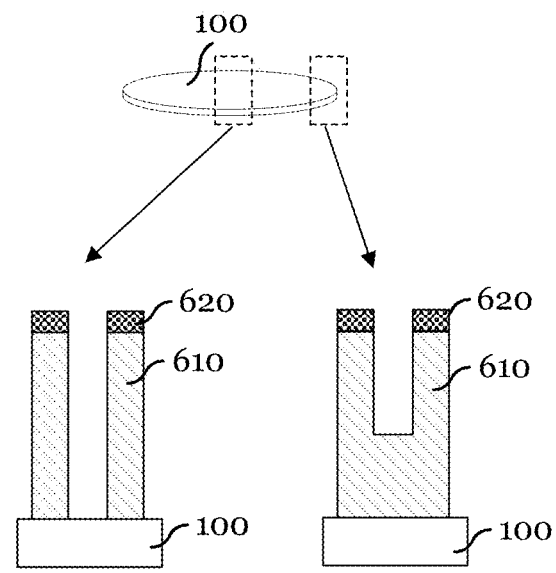
FIG. 6 illustrates a cross sectional view of an example substrate after a plasma etch with non-uniformity near the edge region of the substrate.
Figure 7:
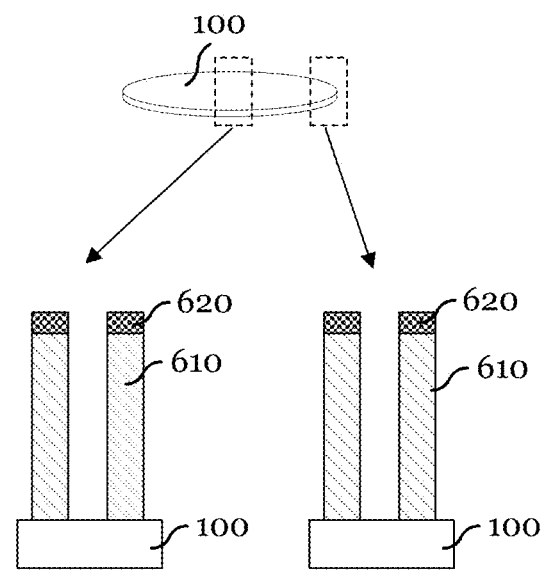
FIG. 7 illustrates a cross sectional view of an example substrate after a plasma etch that uses an additional magnetic field in accordance with various embodiments, where a uniform etch profile across the substrate is enabled.
Figure 8:
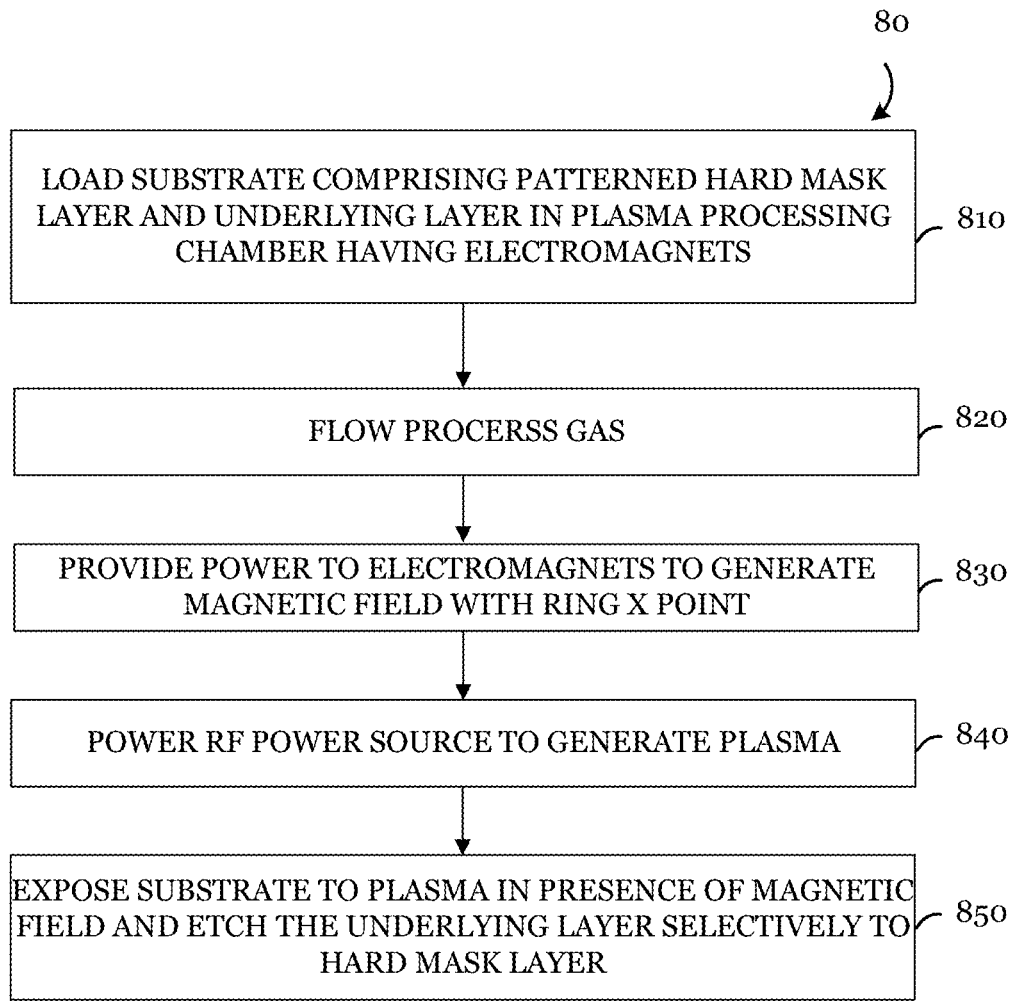
FIG. 8 illustrates an example process flow diagram in accordance with various embodiments.

In the following, example plasma processing systems that incorporate a set of magnets are first described referring to FIGS. 1 and 2. The creation of a ring X point in an additional magnetic field is further described referring to FIG. 3. The effect of the additional magnetic field with the ring X point on electron distribution and etch rate is described referring to FIGS. 4 and 5. Improvement of plasma uniformity through the additional magnetic field is illustrated in FIGS. 6 and 7. An example process flow diagram is illustrated in FIG. 8. All figures in this disclosure are drawn for illustration purpose only and not to scale, including the aspect ratios of features. In this disclosure, the term of the "additional" magnetic field may be used to indicate that the magnetic field applied by magnets is independent from a magnetic field that may be already generated by a RF power source used to generate the plasma.

Figure 1:
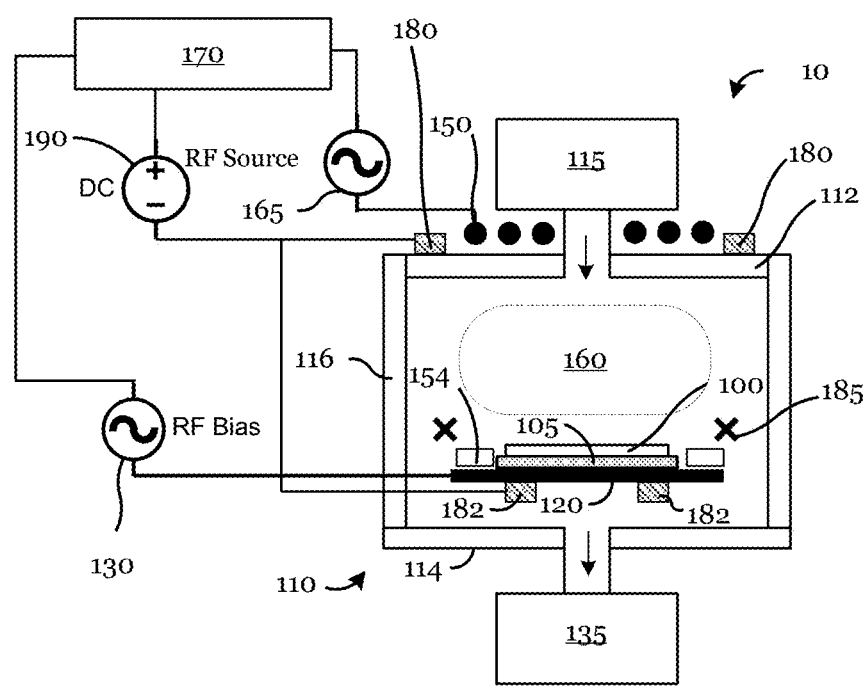
FIG. 1 illustrates an example plasma processing system having a set of magnets in accordance with various embodiments.

FIG. 1 illustrates an example plasma processing system 10 having a set of magnets in accordance with various embodiments.

As illustrated in FIG. 1, the plasma processing system 10 comprises a plasma processing chamber 110, and a substrate 100 may be placed on a substrate holder 105. In various embodiments, the substrate 100 may be a part of, or including, a semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed.

In one or more embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. In various embodiments, the substrate 100 is patterned or embedded in other components of the semiconductor device. In certain embodiments, the substrate 100 may have a diameter of 200 mm or 300 mm.

In various embodiments, the plasma processing system 10 may further comprise a focus ring 154 positioned over a bottom electrode 120 to surround the substrate 100. The focus ring 154 and the substrate 100 may be positioned concentrically. The focus ring 154 may advantageously maintain and extend the uniformity of the plasma 160 to achieve process consistency at the edge of the substrate 100, although it may not eliminate the non-uniformity of the plasma 160 entirely. In various embodiments, the focus ring 154 may have a width of a few cm. In various embodiments, there may be a gap for mechanical clearance between the circumference of the substrate 100 and the focus ring 154. In certain embodiments, the gap may be hundreds of microns to a few mm. In various embodiments, the focus ring 154 may comprise a dielectric material with a desired dielectric constant. In certain embodiments, the focus ring 154 may comprise silicon. Some examples of silicon-based focus ring may comprise silicon, silicon oxide, doped silicon (e.g., boron-doped, nitrogen-doped, and phosphorous-doped), or silicon carbide. Alternatively, in some embodiments, the focus ring may comprise a carbon-based material. In one or more embodiments, the focus ring 154 may comprise a metal oxide, such as aluminum oxide and zirconium oxide.

The plasma processing system 10 may further comprise a gas delivery system 115 configured to deliver a process gas to the plasma processing chamber 110. The gas delivery system 115 may comprise multiple gas flow controllers to control the flow of multiple gases into the plasma processing chamber 110. In some embodiments, optional center/edge splitters may be used to independently adjust the gas flow rates at the center and edge of the substrate 100. Further, in one embodiment, the gas delivery system 115 may have a special showerhead configuration positioned at the top of the plasma processing chamber 110. For example, the gas delivery system 115 may have a showerhead configuration, covering the entirety of the substrate 100, including a plurality of appropriately spaced gas inlets. In one embodiment, the showerhead may be a dual showerhead configured to supply two or more process gases simultaneously. Alternatively, gas may be introduced through dedicated gas inlets of any other suitable configuration. The plasma processing chamber 110 may further be equipped with one or more sensors such as pressure monitors, gas flow monitors, and/or gas species density monitors. The sensors may be integrated as a part of the gas delivery system 115 in various embodiments.

In FIG. 1, the plasma processing chamber 110 is a vacuum chamber and may be evacuated using one or more vacuum pumps 135, such as a single stage pumping system or a multistage pumping system (e.g. a mechanical roughing pump combined with one or more turbomolecular pumps). In order to promote even gas flow during plasma processing, gas may be removed from more than one gas outlet or location in the plasma processing chamber 110 (e.g., on opposite sides of the substrate 100).

In various embodiments, the substrate holder 105 may be integrated with, or a part of, a chuck (e.g., a circular electrostatic chuck (ESC)) positioned near the bottom of the plasma processing chamber 110, and connected to the bottom electrode 120. The surface of the chuck or the substrate holder 105 may be coated with a conductive material (e.g., a carbon-based or metal-nitride based coating). The substrate 100 may be optionally maintained at a desired temperature using a temperature sensor and a heating element connected to a temperature controller (not shown). In certain embodiments, the temperature sensor may comprise a thermocouple, a resistance temperature detector (RTD), a thermistor, or a semiconductor based integrated circuit. The heating element may for example comprise a resistive heater in one embodiment. In addition, there may be a cooling element such as a liquid cooling system coupled to the temperature controller. The bottom electrode 120 may be connected to a RF bias power sources 130.

Further in FIG. 1, a top electrode 150 may be a conductive helical coil electrode located outside the plasma processing chamber 110, positioned above a top plate 112. The top electrode 150 may be connected to RF power source 165 via a controller 170, and accordingly configured to generate an inductively coupled plasma. The top plate 112 may be a dielectric, while a bottom plate 114, and a side wall 116 may be conductive and electrically connected to the system ground (a reference potential).

A typical frequency for the RF source power can range from about 0.1 MHz to about 6 GHz, and can be 13.56 MHz. While only one RF power source for the top electrode 150 is illustrates in FIG. 1, more than one RF power sources may be used in various embodiments, for example, to provide a low frequency RF power and a high frequency RF power at the same time. The plasma 160 may be generated and sustained by continuous wave (CW) or pulsed RF power. In certain embodiments, a second RF power source may be used to provide additional RF fields that may induce azimuthal electric field polarization, which may further enhance the plasma density locally.

In various embodiments, a RF pulsing at a kHz range may be used to power the plasma 160. Using the RF pulsing may help generating high energetic ions (>keV) in the plasma 160 for the plasma etch process, while reducing a charging effect. In certain embodiments, a moderate duty ratio between 40% and 80% may be used. In one embodiment, a bias power of 18 kW may be pulsed at a frequency of 5 kHz with a duty ratio of 60%.

The plasma processing system 10 is particularly characterized by a set of magnets configured to apply an additional magnetic field to the plasma 160, where the additional magnetic field is independent from a magnetic field already generated by the RF power source 165 in the plasma 160. The set of magnets comprise two or more magnets, and the magnets may be permanent magnets, electromagnets, or a combination thereof. In FIG. 1, two electromagnets are illustrated: a first electromagnet 180 and a second electromagnet 182. Both electromagnets are illustrated as electromagnetic coils, and thereby in the cross sectional view of FIG. 1, two cross sections are visible for each of the electromagnetic coil. In various embodiments, the set of magnets is required to enable a ring X point 185 in the additional magnetic field. The ring X point 185 is a point or zone in the magnetic field where the magnetic field is locally neutralized. In certain embodiments, the additional magnetic field applied by the set of magnets is azimuthally symmetric, the ring X point 185 also has a symmetric ring shape. In the cross sectional view of FIG. 1, two cross sectional points of the ring X point 185 are illustrated.

In various embodiments, when using electromagnets, the set of magnets may be connected to a DC power source 190 via the controller 170. In other embodiments, a RF power source may be used to power the set of magnets. In certain embodiments, when using electromagnetic coils, the power or coil currents provided to the set of magnets may be adjusted to control the additional magnetic field and adjust the position of the ring X point 185.

Further, in order to position the ring X point close to the substrate 100, one magnet (e.g., the first electromagnet 180) may be positioned above the substrate 100 and another magnet (e.g., the second electromagnet 182) may be positioned below the substrate. In one embodiment, one magnet (e.g., the first electromagnet 180) may be positioned on the top plate 112 and another magnet (e.g., the second electromagnet 182) may be positioned below the bottom electrode 120, as illustrated in FIG. 1. In certain embodiments, the set of magnets may be positioned at different locations than those illustrated in FIG. 1. For example, one magnet (e.g., the first electromagnet 180) may be positioned on the sidewall 116.

In various embodiments, each of the set of magnets may be positioned concentrically such that the additional magnetic field is azimuthally symmetric. As further described below, the position of the magnets may be selected in consideration of an ideal arrangement of the ring X point, rather than establishing a magnetic field uniformly in the plasma processing chamber 110. This is because the methods in this disclosure are configured to modify the local density of plasma species, particularly near the edge of the substrate 100.

In various embodiments, the controller 170 is coupled to both the top electrode 150 and the set of electromagnets to advantageously enable the synchronous or asynchronous operations of controlling the RF power and the additional magnetic field. With the capability of the controller 170 to control these two parameters simultaneously, the uniformity of the plasma 160 may be finely tuned to achieve the desired etch performance. Further, the controller 170 may be configured to simultaneously control various process parameters such as RF power, the set of electromagnets, the process temperature, the gas flow rates, and the chamber pressure.

In FIG. 1, 2 electromagnetic coils are illustrated, but they are for example only, and any number of magnets, permanent magnets or electromagnets, may be used. Having more than two magnets may advantageously enable better tuning of the magnetic field.

Figure 2:
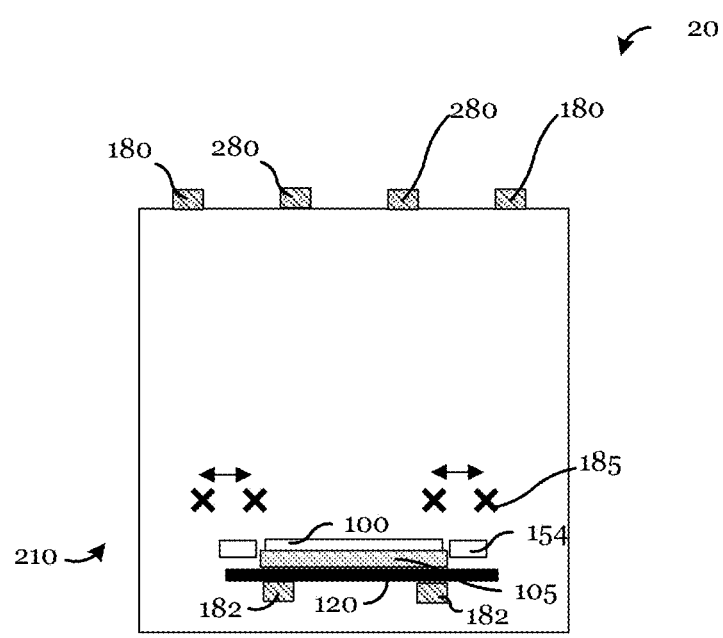
FIG. 2 illustrates another example plasma processing system having a set of three magnets in accordance with alternate embodiments.

FIG. 2 illustrates another example plasma processing system 20 having a set of three magnets in accordance with alternate embodiments.

In FIG. 2, a plasma processing chamber 210 is illustrated, and some details that may be identical to those in FIG. 1 are omitted for illustration purpose. The plasma processing system 20 has a set of three magnets. In addition to a first electromagnet 180 and a second electromagnet 182 similar to prior embodiments in FIG. 1, a third electromagnet 280 is positioned on a top plate of the plasma processing chamber 210 in FIG. 2. Similar to the first two electromagnets, the third electromagnet 280 is also illustrated as an electromagnetic coil, and therefore two cross sections are visible in FIG. 2. In various embodiments, as illustrated in FIG. 2, the first electromagnet 180 and the third electromagnet 280 may be positioned on the same plane with the first electromagnet 180 having a diameter greater than that of the third electromagnet 280.

Addition of a third magnet to the set of magnets may advantageously improve the tuning of the magnetic field and thereby the position of the ring X point 185, particularly when using an electromagnet. For example, the ring X point 185 may initially be formed by two magnets (either permanent magnets, electromagnets, or a combination thereof) at a position. This initial position of the ring X point 185 may be horizontally shifted by powering the third magnet which is an electromagnet, as indicated by arrows in FIG. 2. Although not illustrated, the vertical position of the ring X point 185 may also be adjusted in a similar way.

Because the position of the ring X point 185 affects the local plasma density and its etching ability, such a tuning ability of magnetic field in the plasma processing chamber may advantageously improve the plasma processing performance. A person having ordinary skill in the art will recognize that it is possible to use this method in this disclosure for dynamic adjustment of the magnetic field when a plasma is present in the plasma processing chamber. Accordingly, in various embodiments, a plasma process may include a dynamic control of the magnetic field as a plasma process parameter.

The configurations of the plasma etching system described above is for example only. In alternative embodiments, various alternative configurations may be used for a plasma processing system that incorporates a set of electromagnets. Variations may include types, shapes, and positions of each of the magnets. In certain embodiments, the set of magnets may be positioned inside or outside of the plasma processing chamber. In other embodiments, one or more magnets among the set of magnets may be inside the plasma processing chamber while the others are outside. Further, various types of plasma systems may also be used. For example, the plasma processing system may be a capacitively coupled plasma system or a resonator such as a helical resonator. Further, microwave plasma (MW) or other suitable systems may be used. In various embodiments, the RF power, chamber pressure, substrate temperature, gas flow rates and other plasma process parameters may be selected in accordance with the respective process recipe.

In addition, embodiments of the present invention may be also applied to remote plasma systems as well as batch systems. For example, the substrate holder may be able to support a plurality of wafers that are spun around a central axis as they pass through different plasma zones. Accordingly, it is possible to have multiple plasma zones, for example, including a metal-containing plasma zone, metal-free plasma zone, and plasma-free zone (e.g., a purge zone).

Figure 3:
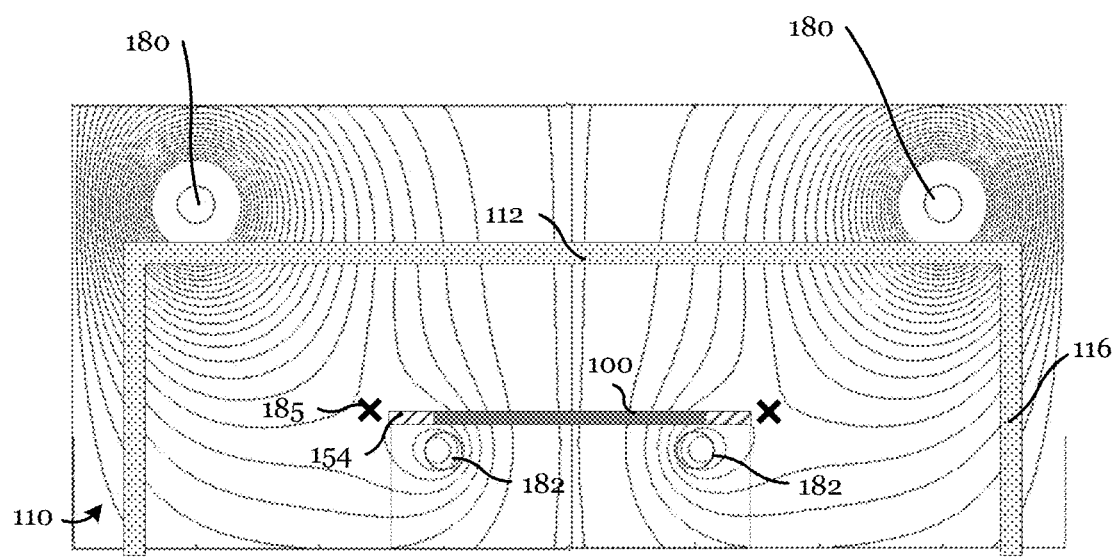
FIG. 3 illustrates an example magnetic field contour map overlaid on a cross sectional view of a plasma processing chamber having a set of magnets in accordance with various embodiments.

FIG. 3 illustrates an example magnetic field contour map overlaid on a cross sectional view of a plasma processing chamber 110 having a set of magnets in accordance with various embodiments. For illustration purpose, some details of the plasma processing chamber 110 that are described above referring to FIG. 1 are omitted in FIG. 3. A top plate 112, a sidewall 116, a substrate 100, a focus ring 154, a first electromagnet, and a second electromagnet 182 are illustrated.

In FIG. 3, an additional magnetic field applied by using the set of magnets in accordance with various embodiments is illustrated as a contour map. The contour map illustrates contours of constant $rA_\phi$, where r is the radial coordinate and $A_\phi$ is the azimuthal component of the magnetic vector potential. The magnet field vector B is tangent to the contours of constant $rA_\phi$. The contour map is obtained from a simulation using an electromagnetic field simulation software. Corresponding to the plasmas processing chamber 110 of FIG. 1, two electromagnetic coils (i.e., the first electromagnet 180 and the second electromagnet 182) are also illustrated. Two cross sections of each coil are visible in FIG. 3. The two coils are provided with currents in the same direction (i.e., clockwise or counterclockwise in a plan view).

When two coplanar coils separated axially have current flowing in the same direction, a ring is formed in the space between the two coplanar coils where the magnetic fields from each coil cancel. In the remainder of the space around the coils, there exists a finite magnetic field. Although not wishing to be limited by any theory, with a magnetic field applied, the electron temperature of the plasma may decreased due to electron trapping in the magnetic field. As a result, electron mobility may be hindered by the magnetic fields. On the other hand, at the ring X point 185, where the magnetic field locally vanishes, this hindering effect is absent. Therefore, at or near the ring X point 185, electron transport and plasma density can be enhanced.

The inventors of this application have identified that the ring X point in the additional magnetic field can be utilized to locally improve the plasma etch performance near the plasma edge for extreme edge process modification. The enhanced plasma provides both an enhanced source of ions and an enhanced source of radicals generated by electron dissociation of molecular process gas species. This local enhancement of ion and radical fluxes may be utilized to correct non-uniformity of etch performance, for example, slower etch rate at the edge portion of the substrate.

Accordingly, the position of the ring X point 185 in the plasma processing chamber 110 may be selected in consideration of the target region for the local enhancement of the plasma density. In various embodiments, the ring X point 185 may be positioned horizontally near the edge of the substrate 100. In certain embodiments, the ring X point 185 is located within ±10% of a diameter of the substrate 100 from an edge of the substrate. In certain embodiments, the ring X point 185 is located within ±5% of a diameter of the substrate 100 from an edge of the substrate. In yet alternate embodiments, the ring X point 185 may be positioned concentrically with the focus ring 154, and located within ±10% of an outer diameter of the focus ring 154 from an outer edge of the focus ring 154. In one embodiment, the diameter of the ring X point may be between 100% and 105% of the outer diameter of the focus ring 154. In another embodiment, the ring X point 185 is located outside the focus ring 154 within 10 mm from the outer edge of the focus ring 154.

In various embodiments, the ring X point 185 may be positioned vertically close to the substrate 100 as well such that the enhanced plasma density may advantageously affect the etch performance on the substrate 100. In certain embodiments, the ring X point 185 may be positioned vertically between the top plate 112 and substrate 100 and closer to the substrate 100 than the top plate 112. In one or more embodiments, the ring X point 185 may be positioned below a third of the distance between the top plate 112 and the substrate 100. In another embodiment, the vertical distance between the ring X point 185 and the substrate 100 may be between 2-10 mm. In yet another embodiment, the ring X point 185 may be positioned at the same vertical level as the substrate 100.

In various embodiments, at least one of the set of magnets may be an electromagnet to enable dynamically changing the additional magnetic field during a plasma processing. In one or more embodiments, the magnetic field may be changed by tuning the current provided to the electromagnet. With controlling the additional magnetic field, the desired position of the ring X point may be realized according to various plasma process recipes and target applications.

In certain embodiments, with the use of electromagnet, the additional magnetic field may be modulated with time. For example, a sinusoidal wave may be used to power one or more electromagnets to enable amplitude modulation of the additional magnetic field with time so that the magnetic field strength periodically changes. In certain embodiments, such a wave may have a frequency higher than the time scale of a plasma process but lower than a RF range that may be used for generating the plasma. In one embodiment, the frequency between 1 Hz and 10 Hz may be used to power one or more electromagnets.

In various embodiments, the dynamic control of the additional magnetic field may be used to dynamically adjust the position of the ring X point during a plasma processing. In alternate embodiments, the additional magnetic field may be dynamically changed, for example by amplitude modulation with time, without causing any change in the position of the ring X point. In this case, although the ring X point remains at the same position, the magnetic field surrounding the ring X point changes with time. Such a dynamic adjustment of the additional magnetic field leads to dynamic control of the local plasma density and therefore may improve the etch performance.

Figure 4:
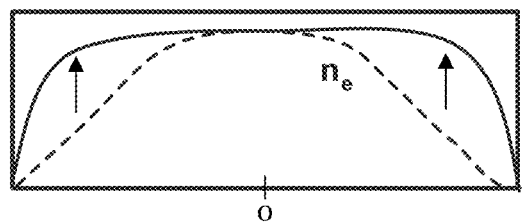
FIG. 4 illustrates the effect of creating a ring X point on electron distribution plotted as a function of radial position relative to the substrate in accordance with one embodiment.

FIG. 4 illustrates the effect of creating a ring X point on electron distribution plotted as a function of radial position relative to the substrate in accordance with one embodiment. FIG. 5 illustrates the effect of creating a ring X point on etch rate as a function of a radial position in a plasma processing chamber in accordance with one embodiment.

In FIG. 4, the electron concentration (n e) as one parameter representing a plasma density is plotted as a function of radial position in the plasma processing chamber. A non-uniform distribution of the electron concentration, which may be present in a conventional plasma condition without an additional magnetic field, is illustrated with a dotted line. In this case, the electron concentration is higher at near the center of the substrate and lower at the edge of the substrate. As described in prior embodiments, an additional magnetic field may be applied to change various plasma species locally, and as illustrated with a solid line, the electron concentration near the edge may be improved. This enhanced plasma density may further improve a local etch rate as described below.

In FIG. 5, the etch rates across a substrate in a plasma processing chamber with a non-uniform distribution of plasma species are illustrated with dotted lines, and solid lines are used to illustrate an improved uniform etch rate profile across the substrate, which may be enabled by various embodiments of the methods disclosed in this application. In the illustrated example, with a conventional plasma etching condition, the non-uniform distribution of plasma species comprising ions and radicals across the substrate, the local etch rate at the edge of the substrate may tend to be lower than at the center of the substrate. This difference in etch rate due to the non-uniformity of plasma can cause various non-ideal etch profiles, for example, footing at the edge and/or bowing at the center. As shown above, by applying and controlling an additional magnetic field that has a ring X point, it is possible to enhance the plasma density locally (e.g., improving at the edge while maintaining the same level at the center). This can then enable increased ion and radical fluxes near the edge of the substrate, thereby improving the local etch rate near the edge.

FIG. 6 illustrates a cross sectional view of an example substrate 100 after a plasma etch with non-uniformity near the edge region of the substrate 100. FIG. 7 illustrates a cross sectional view of an example substrate 100 after a plasma etch that uses an additional magnetic field with a ring X point in accordance with various embodiments, where a uniform etch profile across the substrate 100 is enabled.

As described above, a non-uniformity of a plasma during a plasma etch process may lead to a slower etch rate at the edge region of the substrate 100. As illustrated in FIG. 6, the substrate 100 may comprise an underlying layer 610 and a hard mask layer 620. In FIG. 6, two distinct regions of the substrate 100, a central region and an edge region, are illustrated. Due to the non-uniform distribution of plasma species across the substrate 100, non-uniform recess profiles can be seen.

By applying the additional magnetic field with a ring X point to change the local plasmas density, the local etch rate at the edge region may be improved without affecting the etch rate at other regions using the methods described above in accordance with various embodiments. As a result, uniform vertical recesses may be realized across the substrate 100.

In one or more embodiments, the underlying layer 610 may comprise a polysilicon layer. The polysilicon for the underlying layer 610 may comprise a doped polysilicon to have desired material properties including electrical properties. The polysilicon layer may be deposited over the substrate 100 using appropriate deposition techniques such as vapor deposition including chemical vapor deposition (CVD), physical vapor deposition (PVD), as well as other plasma processes such as plasma enhanced CVD (PECVD), sputtering, and other processes. In one or more embodiments, the underlying layer 610 may have a thickness of about 50 nm to about 500 nm.

In various embodiments, the underlying layer 610 may be patterned by the plasma etch process to form a gate structure or a dummy gate structure for a semiconductor device. Accordingly, the underlying layer 610 may be patterned into a fin, a pillar, or any suitable shape. The patterning of the underlying layer 610 may be performed using a plasma dry etch process, for example a reactive ion etching (RIE) process. In one or more embodiments, such a process may be a silicon etch process using a halogen-based chemistry. In one embodiment, an etch gas may comprise a fluorocarbon such as $C_4F_8$. In various embodiments, the hard mask layer 620 may be used as an etch mask during the plasma etch process.

The hard mask layer 620 may comprise silicon oxide in one embodiment. In various embodiments, the hard mask layer 620 may comprise silicon nitride, silicon carbonitride (SiCN), or silicon oxycarbide (SiOC). In alternate embodiments, the hard mask layer 620 may comprise titanium nitride. In one or more embodiments, the hard mask layer 620 may comprise other suitable organic materials such as spin-on carbon hard mask (SOH) materials. Further, the hard mask layer 620 may be a stacked hard mask comprising, for example, two or more layers using two different materials. In some of such embodiments, the first hard mask of the hard mask layer 620 may comprise a metal-based layer such as titanium nitride, titanium, tantalum nitride, tantalum, tungsten based compounds, ruthenium based compounds, or aluminum based compounds, and the second hard mask material of the hard mask layer 620 may comprise a dielectric layer such as silicon oxide, silicon nitride, SiCN, SiOC, silicon oxynitride, or silicon carbide. The hard mask layer 620 may be deposited using suitable deposition techniques such as vapor deposition including chemical vapor deposition (CVD), physical vapor deposition (PVD), as well as other plasma processes such as plasma enhanced CVD (PECVD), sputtering, and other processes including wet processes. The hard mask layer 620 may have a thickness of about 5 nm to about 50 nm in various embodiments. In one or more embodiments, an additional layer such as silicon-containing anti-reflective coating films (SiARC) or other ARC films may be formed over the hard mask layer 620. In further embodiments, a photoresist that may have been used to pattern the hard mask layer 620 by lithography may be left over the hard mask layer 620.

FIG. 8 illustrates an example process flow diagrams in accordance with various embodiments.

In FIG. 8, a process flow 80 starts with loading a substrate that comprises a patterned hard mask layer and an underlying layer in a plasma processing chamber that comprises a RF power source and a set of electromagnets (block 810). Next, a process gas is flowed into the plasma processing chamber (block 820). Subsequently, a power is provided to the set of electromagnets to generate a magnetic field having a ring X point in the plasma processing chamber (block 830), followed by generating a plasma from the process gas in the plasma processing chamber by powering the RF power source (block 840). In various embodiments, the ring X point may be positioned near an edge of the plasma than near a center of the plasma to change the local plasma density in the processing chamber. The substrate may then be exposed to the plasma in the presence of the magnetic field, enabling etching the underlying layer selectively to the hard mask layer (block 850).

Example embodiments of the invention are summarized here. Other embodiments can also be understood from the entirety of the specification as well as the claims filed herein.

Example 1. A plasma etching system for a substrate that includes: a plasma processing chamber; a substrate holder disposed in the plasma processing chamber; a RF power source configured to generate a plasma in the plasma processing chamber; a first magnet disposed above the substrate holder, the first magnet configured to apply an azimuthally symmetric magnetic field in the plasma processing chamber, the azimuthally symmetric magnetic field being independent from a magnetic field generated by the RF power source; and a second magnet disposed below the substrate holder, the second magnet configured to modify the azimuthally symmetric magnetic field and create a ring X point where the azimuthally symmetric magnetic field is locally neutralized, the ring X point being between the first magnet and the second magnet, where positions of the first magnet and the second magnet are arranged such that the ring X point is located nearer to an edge of the substrate holder than a center of the substrate holder.

Example 2. The plasma etching system of example 1, further including a focus ring surrounding the substrate holder.

Example 3. The plasma etching system of one of examples 1 or 2, further including a third magnet configured to further modify the azimuthally symmetric magnetic field.

Example 4. The plasma etching system of one of examples 1 to 3, where the first magnet or the second magnet is a permanent magnet.

Example 5. The plasma etching system of one of examples 1 to 4, where the first magnet or the second magnet is an electromagnet.

Example 6. The plasma etching system of one of examples 1 to 5, where the first magnet is positioned outside the plasma processing chamber over an upper wall of the plasma processing chamber, and where the second magnet is positioned inside the plasma processing chamber.

Example 7. The plasma etching system of one of examples 1 to 6, where the ring X point is located above the substrate holder.

Example 8. The plasma etching system of one of examples 1 to 7, where the ring X point is located at a position between the substrate holder and an upper wall of the plasma processing chamber, the position being closer to the substrate holder than the upper wall.

Example 9. The plasma etching system of one of examples 1 to 8, where the ring X point is located within ±10% of a diameter of the substrate holder.

Example 10. A plasma etching system for a substrate that includes: a plasma processing chamber; a substrate holder disposed in the plasma processing chamber; a focus ring concentrically surrounding the substrate holder; a RF power source configured to generate a plasma in the plasma processing chamber; and a plurality of magnets configured to apply an azimuthally symmetric magnetic field in the processing chamber, the azimuthally symmetric magnetic field including a ring X point where the azimuthally symmetric magnetic field is locally neutralized, the ring X point being located concentrically with the focus ring.

Example 11. The plasma etching system of example 10, where the plurality of magnets including: a first magnet positioned above the substrate holder; and a second magnet positioned below the substrate holder.

Example 12. The plasma etching system of one of examples 10 or 11, where the plurality of magnets further including: a third magnet positioned above the substrate holder.

Example 13. The plasma etching system of one of examples 10 to 12, where a diameter of the ring X point is between 100% and 105% of an outer diameter of the focus ring.

Example 14. A method of processing a substrate that includes: loading the substrate in a plasma processing chamber, the substrate including a patterned hard mask layer and an underlying layer, the processing chamber including a RF power source and a set of electromagnets; flowing a process gas into the plasma processing chamber; providing power to the set of electromagnets to generate an azimuthally symmetric magnetic field in the plasma processing chamber, the azimuthally symmetric magnetic field including a ring X point where the azimuthally symmetric magnetic field is locally neutralized, the ring X point being located concentrically with the substrate; generating a plasma from the process gas in the plasma processing chamber by powering the RF power source; and while providing the power to the set of electromagnets, exposing the substrate to the plasma and etching the underlying layer selectively to the hard mask layer.

Example 15. The method of example 14, where the set of electromagnets including: a first electromagnet positioned above the substrate holder; and a second electromagnet positioned below the substrate holder.

Example 16. The method of one of examples 14 or 15, further including, while exposing the substrate to the plasma, changing the power to the set of electromagnets to change the azimuthally symmetric magnetic field.

Example 17. The method of one of examples 14 to 16, where changing the power to the set of electromagnets moves a position of the ring X point.

Example 18. The method of one of examples 14 to 17, where changing the power to the set of electromagnets includes amplitude modulation with time.

Example 19. The method of one of examples 14 to 18, further including providing an additional RF field to the plasma.

Example 20. The method of one of examples 14 to 19, where providing the power to the set of electromagnets locally increases a plasma density of the plasma near the ring X point.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
   loading the substrate in a plasma processing chamber, the substrate comprising a patterned hard mask layer and an underlying layer, the plasma processing chamber comprising a RF power source and a set of electromagnets;
   flowing a process gas into the plasma processing chamber;
   providing power to the set of electromagnets to generate an azimuthally symmetric magnetic field in the plasma processing chamber, the azimuthally symmetric magnetic field comprising a ring X point where the azimuthally symmetric magnetic field is locally neutralized, the ring X point being located concentrically with the substrate;
   generating a plasma from the process gas in the plasma processing chamber by powering the RF power source;
   while providing the power to the set of electromagnets, exposing the substrate to the plasma and etching the underlying layer selectively to the patterned hard mask layer; and
   while exposing the substrate to the plasma, changing the power to the set of electromagnets to change the azimuthally symmetric magnetic field.

2. The method of claim 1, wherein the set of electromagnets comprising:
   a first electromagnet positioned above a substrate holder supporting the substrate; and
   a second electromagnet positioned below the substrate holder.

3. The method of claim 1, wherein changing the power to the set of electromagnets moves a position of the ring X point.

4. The method of claim 1, wherein changing the power to the set of electromagnets comprises amplitude modulation with time.

5. The method of claim 1, further comprising providing an additional RF field to the plasma.

6. The method of claim 1, wherein providing the power to the set of electromagnets locally increases a plasma density of the plasma near the ring X point.

7. A method of processing a substrate, the method comprising:
   loading the substrate in a plasma processing chamber, the substrate comprising a patterned hard mask layer and an underlying layer, the plasma processing chamber comprising a RF power source and a set of electromagnets;
   flowing a process gas into the plasma processing chamber;
   positioning a first electromagnet above a substrate holder supporting the substrate and powering the first electromagnet to apply an azimuthally symmetric magnetic field in the plasma processing chamber, the azimuthally symmetric magnetic field being independent from a magnetic field generated by the RF power source;
   positioning a second electromagnet below the substrate holder and powering the second electromagnet to modify the azimuthally symmetric magnetic field and create a ring X point where the azimuthally symmetric magnetic field is locally neutralized, the ring X point being between the first electromagnet and the second electromagnet, wherein positions of the first electromagnet and the second electromagnet are arranged such that the ring X point is located nearer to an edge of the substrate holder than a center of the substrate holder;
   generating a plasma from the process gas in the plasma processing chamber by powering the RF power source; and
   while providing the power to the first and the second electromagnets, exposing the substrate to the plasma and etching the underlying layer selectively to the patterned hard mask layer.

8. The method of claim 7, wherein the first electromagnet is positioned outside the plasma processing chamber over an upper wall of the plasma processing chamber, and wherein the second electromagnet is positioned inside the plasma processing chamber.

9. The method of claim 7, wherein the ring X point is located above the substrate holder.

10. The method of claim 7, wherein the ring X point is located at a position between the substrate holder and an upper wall of the plasma processing chamber, the position being closer to the substrate holder than the upper wall.

11. The method of claim 7, wherein the ring X point is located within ±10% of a diameter of the substrate holder.

12. A method of processing a substrate, the method comprising:
   loading the substrate over a substrate holder in a plasma processing chamber, the substrate comprising a patterned hard mask layer and an underlying layer, the plasma processing chamber comprising a RF power source and a set of magnets, the substrate holder being surrounded by a concentric focus ring;
   flowing a process gas into the plasma processing chamber;
   positioning the set of magnets to generate an azimuthally symmetric magnetic field in the plasma processing chamber, the azimuthally symmetric magnetic field comprising a ring X point where the azimuthally symmetric magnetic field is locally neutralized, the ring X point being located concentrically with the substrate and surrounding the substrate laterally to be proximate to a major plane of the substrate;
   generating a plasma from the process gas in the plasma processing chamber by powering the RF power source; and
   while generating the azimuthally symmetric magnetic field, exposing the substrate to the plasma and etching the underlying layer selectively to the patterned hard mask layer.

13. The method of claim 12, wherein positioning the set of magnets comprises positioning a first magnet above the substrate holder and a second magnet below the substrate holder.

14. The method of claim 13, wherein positioning the set of magnets further comprises positioning a third magnet above the substrate holder.

15. The method of claim 12, wherein a diameter of the ring X point is between 100% and 105% of an outer diameter of the focus ring.

16. The method of claim 12, further comprising while exposing the substrate to the plasma, changing the power to the set of electromagnets to change the azimuthally symmetric magnetic field.

17. The method of claim 16, wherein changing the power to the set of electromagnets moves a position of the ring X point or amplitude modulation with time.

18. The method of claim 12, further comprising providing an additional RF field to the plasma.

19. The method of claim 12, wherein providing the power to the set of electromagnets comprises locally increasing a plasma density of the plasma near the ring X point.

20. The method of claim 13, wherein positions of the first magnet and the second magnet are arranged such that the ring X point is located nearer to an edge of the substrate holder than a center of the substrate holder.

\* \* \* \* \*